US008912836B1

(12) United States Patent
Connell et al.

(10) Patent No.: US 8,912,836 B1
(45) Date of Patent: Dec. 16, 2014

(54) LOW POWER QUADRATURE WAVEFORM GENERATOR

(71) Applicant: Futurewei Technologies, Inc., Plano, TX (US)

(72) Inventors: Lawrence E. Connell, Naperville, IL (US); Daniel P. McCarthy, Elk Grove Village, IL (US); Brian T. Creed, Batavia, IL (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 13/952,767

(22) Filed: Jul. 29, 2013

(51) Int. Cl.
*H03H 11/16* (2006.01)
*H03H 11/22* (2006.01)

(52) U.S. Cl.
CPC ..................... *H03H 11/22* (2013.01)
USPC .......................... 327/255; 327/254

(58) Field of Classification Search
USPC .......................... 327/238, 254, 255
See application file for complete search history.

(56) References Cited

U.S. PATENT DOCUMENTS 7,876,143 B2 * 1/2011 Sasaki ........................ 327/231
8,552,782 B1 * 10/2013 Trueheart et al. ............. 327/254

OTHER PUBLICATIONS

Ghilioni, A., et al. "A 6.5mW Inductorless CMOS Frequency Divider-by-4 Operating up to 70GHz," IEEE International Solid-State Circuits Conference, ISSCC 2011/Session 16/mm-WAVE Design Techniques/16.3, 3 pgs.
Connell, L, et al. "A CMOS Broadband Tuner IC," ISSCC 2002 Visuals Supplement, ISSCC 2002/Session 24/RF Systems/24.3, 3 pgs.
Lu, I. S-C., et al. "A SAW-less GSM/GPRS/EDGE Receiver Embedded in a 65nm CMOS SoC," IEEE International Solid-State Circuits Conference, ISSCC 2011/Session 21/Cellular/21.1, 3 pgs.

* cited by examiner

*Primary Examiner* — Hai L Nguyen
(74) *Attorney, Agent, or Firm* — Conley Rose, P.C.; Grant Rodolph; William H. Dietrich (57) ABSTRACT

An apparatus comprising a frequency divider comprising a first latch configured to receive a first clock signal and a complement of the first clock signal and to generate a first latch first output, and a second latch coupled to the first latch in a toggle-flop configuration, a first output circuit comprising a p-channel transistor, wherein the gate of a p-channel transistor is configured to receive the first clock signal, and a n-channel transistor, wherein the drain of the p-channel transistor is directly connected to the drain of a n-channel transistor, wherein the gate of the n-channel transistor is configured to receive the first latch first output, wherein the source of the n-channel transistor is configured to receive the complement of the first clock signal, and wherein the first output circuit is configured to generate an in-phase reference signal, and a second output circuit configured to generate a quadrature signal.

20 Claims, 5 Drawing Sheets

LOW POWER QUADRATURE WAVEFORM GENERATOR

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Quadrature generators may be used in mobile wireless communication devices, such as cell phones or smart phones, as part of, as an example, a local oscillator (LO) circuit. Given the constraints on power consumption of modern mobile wireless communication devices it is desirable to find new ways to reduce power consumption without sacrificing performance. An improved quadrature waveform generator circuit configuration is one means for reducing power consumption of a quadrature generator and therefore a communication device.

SUMMARY

In one embodiment, the disclosure includes an apparatus comprising a frequency divider comprising a first latch configured to receive a first clock signal and a complement of the first clock signal and to generate a first latch first output, and a second latch coupled to the first latch in a toggle-flop configuration, wherein the second latch is configured to receive the first clock signal and the complement of the first clock signal, a first output circuit comprising a p-channel transistor, wherein the gate of the p-channel transistor is configured to receive the first clock signal, and wherein the source of the p-channel transistor is configured to receive a voltage supply, and a n-channel transistor, wherein the drain of the p-channel transistor is directly connected to the drain of the n-channel transistor, wherein the gate of the n-channel transistor is configured to receive the first latch first output, and wherein the source of the n-channel transistor is configured to receive the complement of the first clock signal; and a second output circuit configured to receive the first clock signal and the complement of the first clock signal, wherein the first output circuit is configured to generate a first in-phase reference signal and the second output circuit is configured to generate a first quadrature signal.

In another embodiment, the disclosure includes an apparatus comprising an output circuit comprising a p-channel transistor, wherein the gate of the p-channel transistor is configured to receive a first clock signal, and a n-channel transistor, wherein the gate of the n-channel transistor is configured to receive a first output signal of a frequency divider, wherein the source of the n-channel transistor is configured to receive a complement of the first clock signal, and wherein the p-channel transistor and the n-channel transistor are connected in series, and an inverter directly connected to the drain of the n-channel transistor, wherein the inverter is configured to generate a first in-phase reference signal.

In yet another embodiment, the disclosure includes a method comprising receiving a first clock signal and a complement of the first clock signal by a frequency divider, a first output circuit and a second output circuit, wherein the frequency divider comprises a first latch and a second latch coupled to the first latch in a toggle-flop configuration, wherein the first latch and the second latch receive the first clock signal and the complement of the first clock signal, wherein the first latch generates a first latch first output, and wherein the second latch generates a second latch first output, generating a first in-phase reference signal, by a first output circuit, based on the first clock signal, the complement of the first clock signal, and the first latch first output, wherein the first output circuit comprises a p-channel transistor, wherein the gate of a p-channel transistor receives the first clock signal, a n-channel transistor, wherein the drain of the p-channel transistor is directly connected to the drain of a n-channel transistor, wherein the gate of the n-channel transistor receives the first latch first output, and wherein the source of the n-channel transistor receives the complement of the first clock signal, and a first inverter directly connected to the drain of the n-channel transistor, wherein the first in-phase reference signal is generated at an output of the first inverter; and generating a first quadrature signal, by a second output circuit, based on the first clock signal, the complement of the first clock signal, and the second latch first output.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein one or more embodiments of an improved quadrature waveform output circuit configured to provide a quadrature waveform signal while reducing capacitive loading on one or more clock buffers and thereby reducing power consumption, as disclosed herein.

Figure 1:
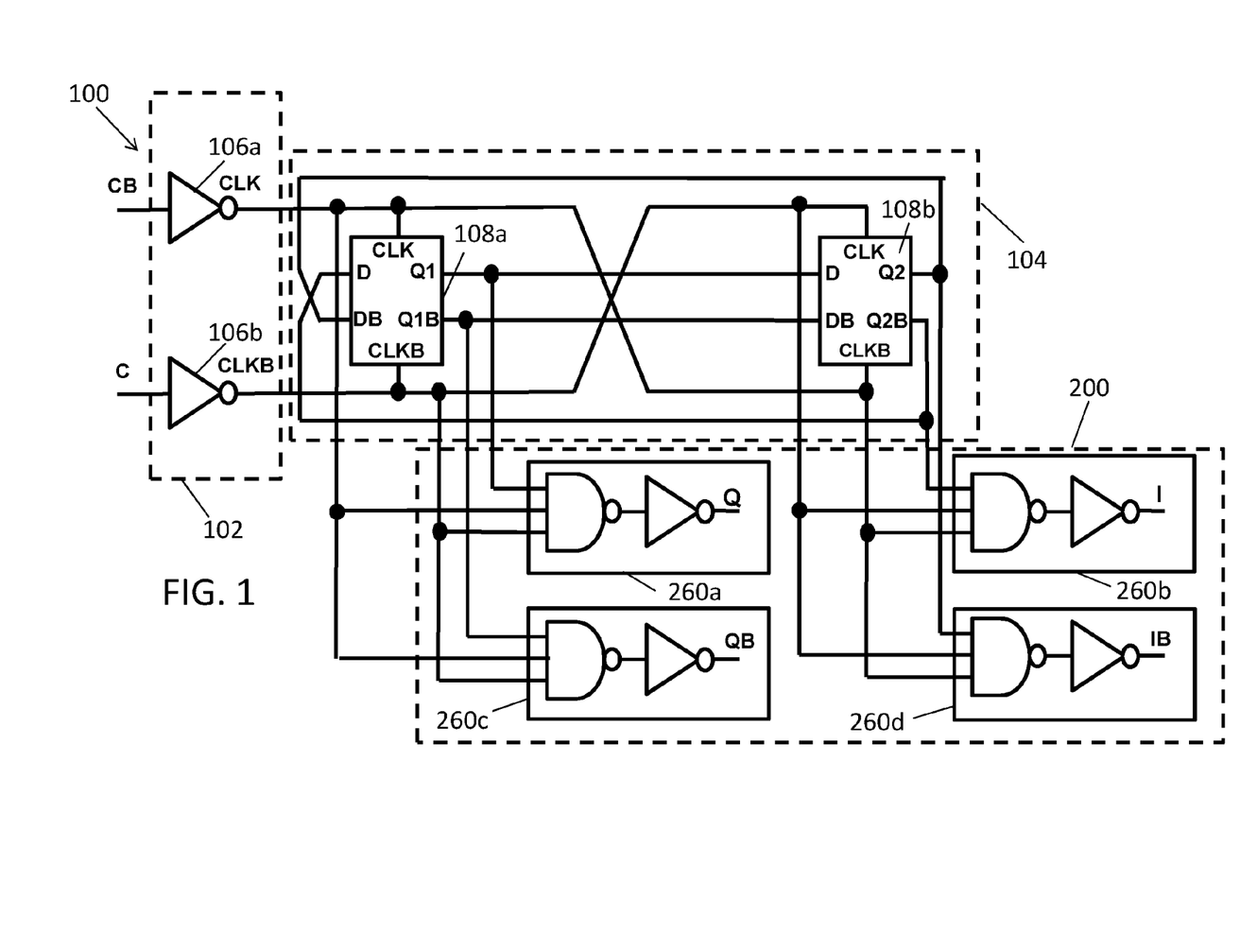
FIG. 1 is a schematic diagram of an embodiment of a quadrature generator.

FIG. 1 is a schematic diagram of an embodiment of a quadrature generator 100. In such an embodiment, the quadrature generator 100 comprises an input buffer 102, a frequency divider 104, and a quadrature waveform generator 200. The input buffer 102 comprises a pair of inverters and may also be referred to as "clock buffers" (e.g., a first clock buffer 106a and a second clock buffer 106b). The input buffer 102 is generally configured to receive an input clock signal (denoted as C) and an input clock bar (denoted as CB) signal and to distribute a clock signal (denoted as CLK) signal and a clock bar signal (denoted as CLKB) (the clock bar signal CLKB is sometimes referred to herein as a complement of the clock signal CLK) to one or more components of the quadrature generator 100, for example, the frequency divider 104 and the quadrature waveform generator 200. For example, the first clock buffer 106a and the second clock buffer 106b may be configured to receive the input CB signal and the input C signal and to output the CLK signal and the CLKB signal, respectively. It is noted that one way to generate a CLKB signal is to pass the CLK signal through an inverter, which may introduce a small time delay between transitions of the CLK signal and the CLKB signal. Such a small time delay would not upset the operation of the quadrature generator 100. The input C signal and the input CB signal may be periodic signals, such as sinusoidal ("sine") waves or square waves. If the input C signal and the input CB signal are sine waves, the clock buffers 106a, 106b may be employed to "square up" the signal, for example, to create output signals that are square waves. Alternatively, the input buffer 102 (i.e., the clock buffers 106a, 106b) is optional if the input C signal and the input CB signal are square waves.

In an embodiment, the frequency divider 104 is configured to divide an input frequency by different amounts (e.g., one-half frequency, one-fourth frequency, and so on). For example, two latches connected in a feedback shift register configuration can provide an output signal with a frequency that is one-half the input frequency. In the embodiment of FIG. 1, the frequency divider 104 comprises two latches (e.g., a first latch 108a and a second latch 108b) configured in a feedback or toggle-flop configuration. In an embodiment, the latches 108a, 108b may be as described in U.S. patent application Ser. No. 13/934,306 filed Jul. 3, 2013 and entitled "Low Power High Speed Quadrature Generator," by Lawrence Connell, et al., which is hereby incorporated by reference in its entirety. Alternatively, any other suitable latch may be employed as would be appreciated by one of ordinary skill in the art upon viewing this disclosure. In the embodiment of FIG. 1, each latch 108a, 108b is configured to generate a first output signal (e.g., an output signal Q1 or an output signal Q2) and a second output signal (e.g., an output signal Q1B or an output signal Q2B), respectively.

In an embodiment, the quadrature waveform generator 200 is configured to receive the first output signal and the second output signal from each of the latches 108a, 108b and to output an in-phase reference waveform signal, for example, an "in-phase signal" (e.g., a first in-phase output signal I and/or a second in-phase output signal IB) and a quadrature waveform signal, for example, a "quadrature signal" (e.g., a first quadrature output signal Q and/or a second quadrature output signal QB). Additionally, in an embodiment, each of the output signals (e.g., the output signal Q, the output signal QB, the output signal I, and the output signal IB) may have a duty cycle of about 25% (i.e., each output is "high" approximately 25% of the time and "low" 75% of the time within a period), assuming the CLK signal and the CLKB signal have a duty cycle of 50%. Further, in an embodiment, the output signals are high during approximately non-overlapping time intervals, except that they may overlap during rise and fall transitions. Starting with the I signal, Q may be delayed 90 degrees out of phase with I, then IB will be delayed 90 degrees out of phase with Q, and then QB will be delayed 90 degrees out of phase with IB.

In the embodiment of FIG. 1, the quadrature waveform generator 200 comprises a plurality of output circuits (e.g., a first output circuit 260a, a second output circuit 260b, a third output circuit 260c, and a fourth output circuit 260d). Each of the output circuits 260a-260d comprises a NAND gate followed by an inverter as shown in FIG. 1. The first output circuit 260a is configured to receive the first output signal (e.g., the output signal Q1) from the first latch 108a, the CLK signal, and the CLKB signal and to output a first quadrature signal (e.g., an output signal Q). The second output circuit 260b is configured to receive the first output signal (e.g., the output signal Q2B) from the second latch 108b, the CLK signal, and the CLKB signal and to output a first in-phase signal (e.g., an output signal I). The third output circuit 260c is configured to receive the second output signal (e.g., the output signal Q1B) from the first latch 108a, the CLK signal, and the CLKB signal and to output a second quadrature signal (e.g., an output signal QB). The fourth output circuit 260d is configured to receive the second output signal (e.g., the output signal Q2) from the second latch 108b, the CLK signal, and the CLKB signal and to output a second in-phase signal (e.g., an output signal IB).

Although each NAND gate in the output circuits 260a-260d is shown as having three inputs, each NAND gate is intended to perform a logical NAND operation of two of the inputs. The NAND gate in output circuit 260a is intended to perform the logical NAND of Q1 and CLKB. The NAND gate in output circuit 260b is intended to perform the logical NAND of Q2B and CLK. The NAND gate in output circuit 260c is intended to perform the logical NAND of Q1B and CLKB. The NAND gate in output circuit 260d is intended to perform the logical NAND of Q2 and CLK. Thus, each of the NAND gates may optionally have only two inputs.

Figure 2:
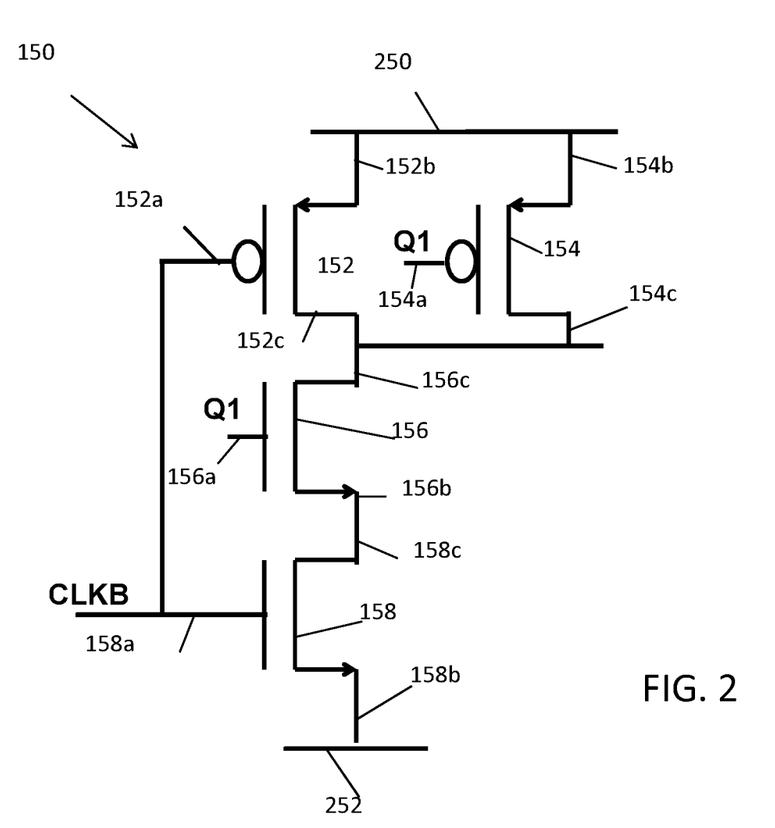
FIG. 2 is a schematic diagram of an embodiment of a NAND gate.

FIG. 2 is a schematic diagram of an embodiment of a NAND gate 150. In such an embodiment, the NAND gate 150 comprises a first p-channel transistor 152 (e.g., a p-channel metal-oxide-semiconductor field-effect transistor (MOSFET) or PMOS) in parallel with a second p-channel transistor 154 and in series with a first n-channel transistor 156 (e.g., an n-channel MOSFET or NMOS) and a second n-channel transistor 158. In the embodiment of FIG. 2, a gate 152a of the first p-channel transistor 152 is configured to receive a first clock signal (e.g., the CLK signal or the CLKB signal), a source 152b of the first p-channel transistor 152 is coupled to a positive voltage supply 250, and a drain 152c of the first p-channel transistor 152 is coupled to a drain 156c of the first n-channel transistor 156. Additionally, the second p-channel transistor 154 is configured such that a gate 154a is configured to receive a signal (e.g., output signal Q1, output signal Q2, output signal Q1B, or output signal Q2B), a source 154b is coupled to the positive voltage supply 250, and a drain 154c is coupled to the drain 156c of the first n-channel transistor 156. Additionally, a gate 156a of the first n-channel transistor 156 is configured to receive a signal (e.g., the output signal Q1, the output signal Q2, the output signal Q1B, or the output signal Q2B), and a source 156b of the n-channel transistor 156 is coupled to a drain 158c of the second n-channel transistor 158. Further, a gate 158a of the second n-channel transistor 158 is configured to receive the first clock signal (e.g., the CLK signal or the CLKB signal) and a source 158b of the second n-channel transistor 158 is coupled to a voltage supply ground 252.

Figure 3:
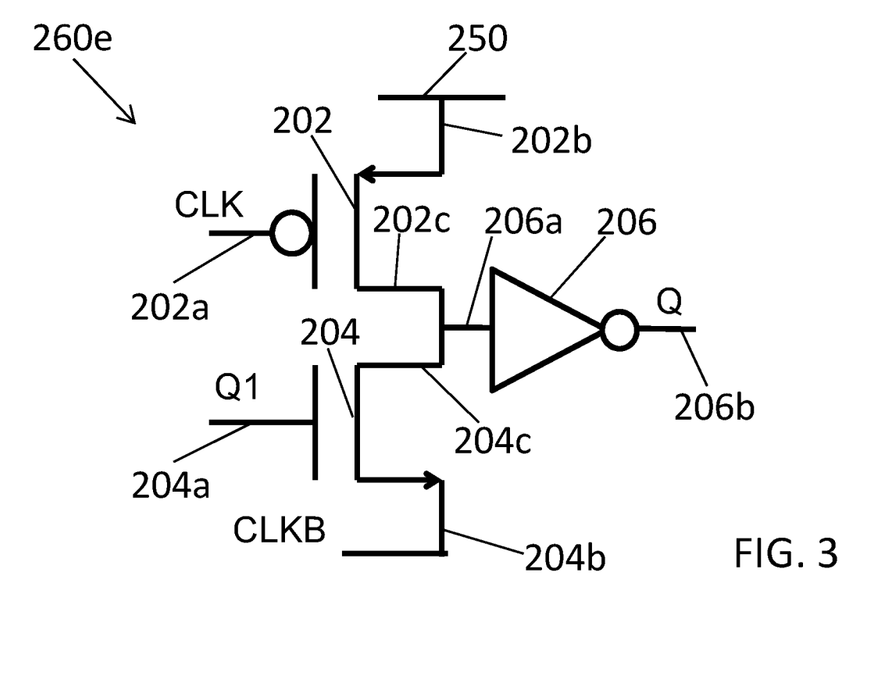
FIG. 3 is a schematic diagram of an embodiment of an output circuit.

Referring to FIG. 3, an embodiment of an output circuit is illustrated as output circuit 260e. The output circuit 260e comprises an electronic circuit 261 generally configured to provide the functionality of a NAND digital logic gate in series with an inverter 206. In the embodiment of FIG. 3, the electronic circuit 261 comprises a p-channel transistor 202 in series with an n-channel transistor 204. As understood by a person of ordinary skill in the art, each p-channel transistor and n-channel transistor referenced herein comprises a source, a drain, and a gate. In the output circuit 260e, a gate 202a of the p-channel transistor 202 is configured to receive a first clock signal (e.g., the CLK signal or the CLKB signal), a source 202b of the p-channel transistor 202 is coupled to a positive voltage supply 250, and a drain 202c of the p-channel transistor 202 is coupled to a drain 204c of the n-channel transistor 204 and an input 206a of the inverter 206. Additionally, a gate 204a of the n-channel transistor 204 is configured to receive an output signal (e.g., the output signal Q1, the output signal Q2, the output signal Q1B, or the output signal Q2B) of a latch (e.g., latch 108a, 108b), and a source 204b of the n-channel transistor 204 is configured to receive a second clock signal (e.g., the CLKB signal or the CLK signal). Further, the inverter 206 is configured to output an in-phase reference signal (e.g., the output signal I or the output signal IB) or a quadrature signal (e.g., the output signal Q or the output signal QB) via an output 206b.

The operation of NMOS and PMOS transistors is well known to a person having ordinary skill in the art. However, for the sake of illustration, the operation of the output circuit 206e is briefly described with respect to FIG. 3. The terms "high" and "low" may be understood by a person of ordinary skill in the art in the context of digital logic to refer to voltage states assigned to binary 1 or 0 (or vice versa). When the CLK signal goes low (and its complement CLKB goes high), the p-channel transistor 202 is on and the input 206a of the inverter 206 is coupled to a voltage high (e.g., the power supply voltage). As such, when the p-channel transistor 202 is on, the positive voltage supply 250 applies a voltage (i.e., a voltage high) to the input 206a of the inverter 206. When the CLK signal goes high (and its complement CLKB goes low), the p-channel transistor 202 is off and the input 206a of the inverter 206 may or may not be coupled to a voltage low (e.g., electrical ground). For instance, when the complement CLKB goes low and the first output signal (e.g., the output signal Q1) of the latch is high, the n-channel transistor 204 is on and couples the input 206a of the inverter 206 to ground. Alternatively, when the first output signal (e.g., the output signal Q1) of the latch is low, the n-channel transistor 204 is off and does not couple the input 206a of the inverter 206 to ground.

Figure 4:
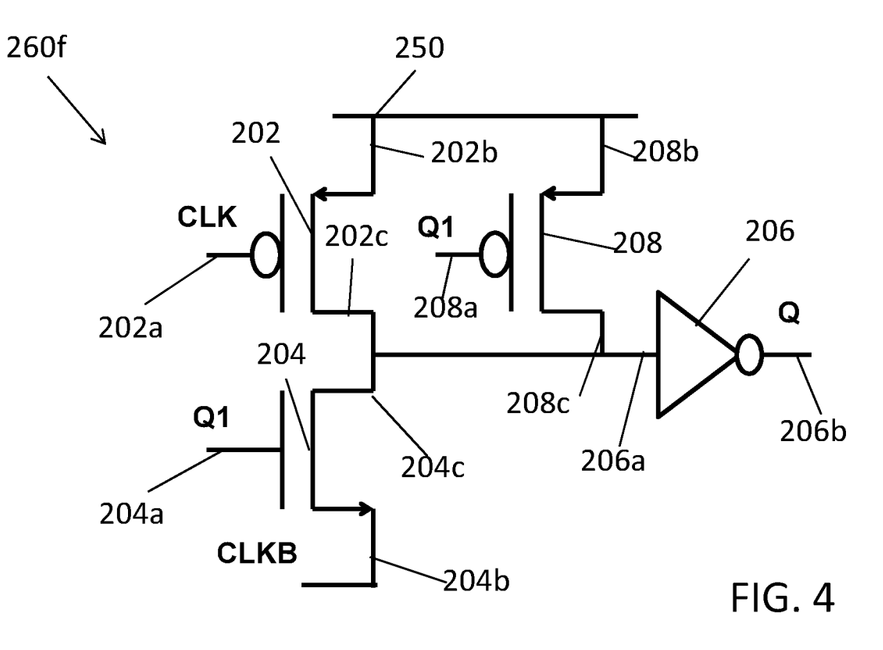
FIG. 4 is a schematic diagram of another embodiment of an output circuit.

Referring to FIG. 4, an alternative embodiment of an output circuit 260f is illustrated. The output circuit 260f comprises an electronic circuit 262 generally configured to provide the functionality of a NAND digital logic gate in series with the inverter 206. In such an embodiment, the output circuit 260f comprises the configuration of output circuit 260e (as shown in FIG. 3) and further comprises a second p-channel transistor 208 in series with the n-channel transistor 204 and in parallel with the p-channel transistor 202. For example, the second p-channel transistor 208 is configured such that a gate 208a is configured to receive an output signal (e.g., output signal Q1, output signal Q2, output signal Q1B, or output signal Q2B) of a latch (e.g., latch 108a, 108b), a source 208b is coupled the positive voltage supply 250, and a drain 208c is coupled to the drain 204c of the n-channel transistor 204 and the input 206a of the inverter 206.

Additionally, the output circuits 260e and/or 260f may be configured such that in response to a predetermined configuration of input signals the output circuits 260e and/or 260f are forced into a known state (i.e., having a known output signal), for example, a standby mode.

Figure 5:
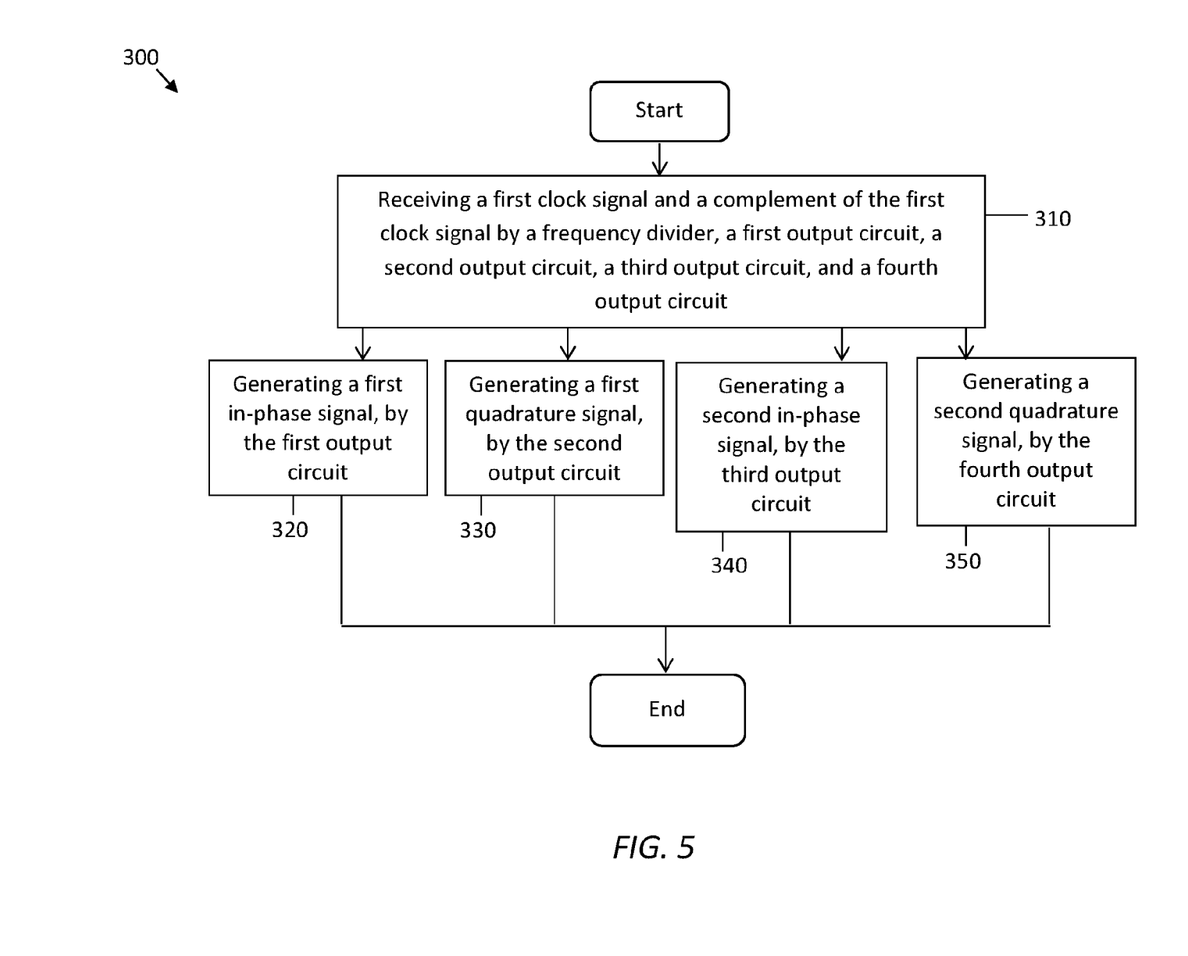
FIG. 5 is an embodiment of a method of generating in-phase reference and quadrature signals.

FIG. 5 is an embodiment of a method 300 for generating an in-phase reference and a quadrature signals. The embodiment 300 begins in block 310. In block 310, a first clock signal (e.g., the CLK signal) and a complement of the first clock signal (e.g., the CLKB signal) are received by a frequency divider, such as frequency divider 104, a first output circuit, such as output circuit 260a, a second output circuit, such as output circuit 260b, a third output circuit, such as output circuit 260c, and a fourth output circuit, such as output circuit 260d. Thus, the frequency divider and the output circuits may be coupled as shown in FIG. 1 with the output circuits configured as shown in FIG. 3 or 4 (i.e., the output circuits 260a-260d may be the same as output circuits 260e or 260f). Next in block 320 a first in-phase signal (e.g., I or IB in FIG. 1) is generated by the first output circuit. Similarly, in block 330 a first quadrature signal (e.g., Q or QB in FIG. 1) may be generated by a second output circuit. Similarly, in block 340 a second in-phase signal (e.g., I or IB in FIG. 1) may be generated by a third output circuit. Finally, in block 350 a second quadrature signal (e.g., Q or QB in FIG. 1) may be generated by a fourth output circuit.

In an embodiment, the electronic circuit 261, 262 of the output circuit (e.g., output circuit 260e, 260f, respectively) as previously disclosed provides the functionality of a NAND digital logic gate while employing fewer transistors than a conventional NAND gate, for example, a NAND gate 150 as shown in FIG. 2. As such, reducing the number of transistors decreases the capacitive load on a clock buffer (e.g., clock buffer 106a, 106b as shown in FIG. 1) used to operate circuit and thereby reduces power consumption. Additionally, reducing the number of transistors reduces the average switching current of the output circuit. To further demonstrate the utility of the output circuit (e.g., output circuit 260e, 260f), suppose a quadrature generator 100 employing an output circuit comprising a conventional NAND gate (i.e., NAND gate 150 shown in FIG. 2) for the NAND gates in output circuits 260a-260d is compared to a quadrature generator 100 employing the output circuit 260f for output circuits 260a-260d. For the quadrature generator 100 with the NAND gate 150 and an input clock frequency of about 5.38 gigahertz (GHz), the current drain is about 3.118 milliamps (mA) with an output phase noise of −158.7 decibels relative to carrier (dBc) at a 30 megahertz (MHz) frequency offset and an output phase noise of −161.1 dBc at a 120 MHz offset. For the quadrature generator 100 with the output circuit 260f and an input clock frequency of about 5.38 GHz, the current drain is about 2.743 mA (or a 12% decrease) with an output phase noise of −158.6 dBc at a 30 MHz offset and an output phase noise of −161 dBc at a 120 MHz offset. Thus power consumption is reduced while maintaining approximately the same phase noise.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations may be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. The use of the term "about" means +/−10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having may be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. An apparatus comprising:
  a frequency divider comprising:
    a first latch configured to receive a first clock signal and a complement of the first clock signal and to generate a first latch first output; and
    a second latch coupled to the first latch in a toggle-flop configuration, wherein the second latch is configured to receive the first clock signal and the complement of the first clock signal;
    a first output circuit comprising:
      a p-channel transistor, wherein a gate of the p-channel transistor is configured to receive the first clock signal, and wherein a source of the p-channel transistor is configured to receive a voltage supply; and
      a n-channel transistor, wherein a drain of the p-channel transistor is directly connected to the drain of the n-channel transistor, wherein the gate of the n-channel transistor is configured to receive the first latch first output, and wherein the source of the n-channel transistor is configured to receive the complement of the first clock signal; and
    a second output circuit configured to receive the first clock signal and the complement of the first clock signal,
    wherein the first output circuit is configured to generate a first in-phase reference signal and the second output circuit is configured to generate a first quadrature signal.

2. The apparatus of claim 1, wherein the first output circuit further comprises a third p-channel transistor, wherein the gate of the third p-channel transistor is directly connected to the first latch first output, wherein the source of the third p-channel transistor is configured to connect to the voltage supply, and wherein the drain of the third p-channel transistor is directly connected to the drain of the n-channel transistor.

3. The apparatus of claim 1, wherein the second latch is configured to generate a second latch first output, and wherein the second output circuit comprises:
  a second p-channel transistor, wherein the gate of the second p-channel transistor is configured to receive the complement of the first clock signal, and wherein the source of the second p-channel transistor is configured to connect to the voltage supply; and
  a second n-channel transistor, wherein the drain of the second p-channel transistor is directly connected to the drain of the second n-channel transistor, wherein the gate of the second n-channel transistor is coupled to the second latch first output, and wherein the source of the second n-channel transistor is configured to receive the first clock signal.

4. The apparatus of claim 3, further comprising:
  a first inverter directly connected to the drain of the n-channel transistor, wherein an output of the first inverter is configured to generate the first in-phase reference signal; and
  a second inverter directly connected to the drain of the second n-channel transistor, wherein an output of the second inverter is configured to generate the first quadrature signal.

5. The apparatus of claim 3, wherein the second output circuit further comprises a fourth p-channel transistor, wherein the gate of the fourth p-channel transistor is directly connected to the second latch first output, wherein the source of the fourth p-channel transistor is configured to connect to the voltage supply, and wherein the drain of the fourth p-channel transistor is directly connected to the drain of the second n-channel transistor.

6. The apparatus of claim 3, wherein the first latch is further configured to generate a first latch second output, wherein the second latch is further configured to generate a second latch second output, wherein the apparatus further comprises:
  a third output circuit configured to:
    receive the first latch second output, the first clock signal, and the complement of the first clock signal; and
    generate a second in-phase reference signal; and
  a fourth output circuit configured to:
    receive the second latch second output, the first clock signal, and the complement of the first clock signal; and
    generate a second quadrature signal.

7. The apparatus of claim 6, wherein the third output circuit comprises a fifth p-channel transistor, wherein the gate of the fifth p-channel transistor is configured to receive the first clock signal, the source of the fifth p-channel transistor is configured to connect to the voltage supply, wherein the drain of the fifth p-channel transistor is directly connected to the drain of a third n-channel transistor, wherein the gate of the third n-channel transistor is directly connected to the second output of the first latch, and wherein the source of the third n-channel transistor is configured to receive the complement of the first clock signal; and     wherein the fourth output circuit comprises a sixth p-channel transistor, wherein the gate of the sixth p-channel transistor is configured to receive the complement of the first clock signal, wherein the source of the sixth p-channel transistor is configured to connect to the voltage supply, wherein the drain of the sixth p-channel transistor is directly connected to the drain of a fourth n-channel transistor, wherein the gate of the fourth n-channel transistor is directly connected to the second output of the second latch, and wherein the source of the fourth n-channel transistor is configured to receive the first clock signal.

8. The apparatus of claim 7, further comprising:

a third inverter directly connected to the drain of the third n-channel transistor, wherein an output of the third inverter is configured to generate the second in-phase reference signal; and a fourth inverter directly connected to the drain of the fourth n-channel transistor, wherein an output of the fourth inverter is configured to generate the second quadrature signal.

9. The apparatus of claim 7, wherein the third output circuit further comprises a seventh p-channel transistor, wherein the gate of the seventh p-channel transistor is directly connected to the second output of the first latch, wherein the source of the seventh p-channel transistor is configured to connect to the voltage supply, and wherein the drain of the seventh p-channel transistor is directly connected to the drain of the third n-channel transistor.

10. The apparatus of claim 7, wherein the fourth output circuit further comprises an eighth p-channel transistor, wherein the gate of the eighth p-channel transistor is directly connected to the second output of the second latch, wherein the source of the eighth p-channel transistor is configured to connect to the voltage supply, and wherein the drain of the eighth p-channel transistor is directly connected to the drain of the fourth n-channel transistor.

11. An apparatus comprising:

an output circuit comprising:

a p-channel transistor, wherein a gate of the p-channel transistor is configured to receive a first clock signal; and a n-channel transistor, wherein the gate of the n-channel transistor is configured to receive a first output signal of a frequency divider, wherein a source of the n-channel transistor is configured to receive a complement of the first clock signal, and wherein the p-channel transistor and the n-channel transistor are connected in series; and an inverter directly connected to a drain of the n-channel transistor, wherein the inverter is configured to generate a first in-phase reference signal.

12. The apparatus of claim 11, wherein the source of the p-channel transistor is configured to connect to a voltage supply, and wherein the drain of the p-channel transistor is directly connected to the drain of the n-channel transistor.

13. The apparatus of claim 12, wherein the output circuit further comprises a second p-channel transistor, wherein the gate of the p-channel transistor is directly connected to the first output of the frequency divider, wherein the source of the second p-channel transistor is configured to connect to the voltage supply, and wherein the drain of the second p-channel transistor is directly connected to the drain of the n-channel transistor.

14. The apparatus of claim 11, wherein the frequency divider comprises a first latch and a second latch configured in a toggle-flop configuration, wherein the first latch is configured to generate the first output signal of the frequency divider and a second output signal, and a wherein the apparatus further comprises:

a second output circuit comprising:

a second p-channel transistor, wherein the gate of the second p-channel transistor is configured to receive the first clock signal;

a second n-channel transistor, wherein the gate of the second n-channel transistor is configured to receive the second output signal, wherein the source of the second n-channel transistor is configured to receive the complement of the first clock signal, and wherein the second p-channel transistor and the second n-channel transistor are connected in series; and a second inverter directly connected to the drain of the second n-channel transistor, wherein the second inverter is configured to generate a second in-phase signal.

15. The apparatus of claim 14, wherein the second output circuit further comprises a third p-channel transistor, wherein the gate of the third p-channel transistor is configured to receive the second output signal, wherein the source of the third p-channel transistor is configured to connect to a voltage supply, and wherein the drain of the third p-channel transistor is directly connected to the drain of the second n-channel transistor.

16. A method comprising:

receiving a first clock signal and a complement of the first clock signal by a frequency divider, a first output circuit and a second output circuit, wherein the frequency divider comprises a first latch and a second latch coupled to the first latch in a toggle-flop configuration, wherein the first latch and the second latch receive the first clock signal and the complement of the first clock signal, wherein the first latch generates a first latch first output, and wherein the second latch generates a second latch first output;

generating a first in-phase reference signal, by the first output circuit, based on the first clock signal, the complement of the first clock signal, and the first latch first output, wherein the first output circuit comprises:

a p-channel transistor, wherein a gate of the p-channel transistor receives the first clock signal;

a n-channel transistor, wherein a drain of the p-channel transistor is directly connected to the drain of the n-channel transistor, wherein the gate of the n-channel transistor receives the first latch first output, and wherein a source of the n-channel transistor receives the complement of the first clock signal; and a first inverter directly connected to the drain of the n-channel transistor, wherein the first in-phase reference signal is generated at an output of the first inverter; and generating a first quadrature signal, by the second output circuit, based on the first clock signal, the complement of the first clock signal, and the second latch first output.

17. The method of claim 16, wherein the second output circuit comprises:

a second p-channel transistor, wherein the gate of the second p-channel transistor receives the complement of the first clock signal; and a second n-channel transistor, wherein the drain of the second p-channel transistor is directly connected to the drain of the second n-channel transistor, wherein the gate of the second n-channel transistor receives the second latch first output, and wherein the source of the second n-channel transistor receives the first clock signal, and a second inverter directly connected to the drain of the second n-channel transistor, wherein the first quadrature signal is generated at an output of the second inverter.

18. The method of claim 17, wherein the first output circuit further comprises a third p-channel transistor, wherein the gate of the third p-channel transistor receives the first latch first output, and wherein the drain of the third p-channel transistor is directly connected to the drain of the n-channel transistor; and wherein the second output circuit further comprises a fourth p-channel transistor, wherein the gate of the fourth p-channel transistor is configured to receive the second latch first output, and wherein the drain of the fourth p-channel transistor is directly connected to the drain of the second n-channel transistor.

19. The method of claim 17, wherein the first latch further generates a first latch second output, and wherein the method further comprises:

generating a second in-phase reference signal, by a third output circuit, based on the first clock signal, the complement of the first clock signal, and the first latch second output, wherein the third output circuit comprises:

a third p-channel transistor, wherein the gate of the third p-channel transistor receives the first clock signal;

a third n-channel transistor, wherein the drain of the third p-channel transistor is directly connected to the drain of the third n-channel transistor, wherein the gate of the third n-channel transistor receives the first latch second output, and wherein the source of the third n-channel transistor receives the complement of the first clock signal; and a third inverter directly connected to the drain of the third n-channel transistor, wherein the second in-phase reference signal is generated at an output of the third inverter.

20. The method of claim 19, wherein the second latch further generates a second latch second output, and wherein the method further comprises:

generating a second quadrature signal, by a fourth output circuit, based on the first clock signal, the complement of the first clock signal, and the second latch second output, wherein the fourth output circuit comprises:

a fourth p-channel transistor, wherein the gate of the fourth p-channel transistor receives the complement of the first clock signal;

a fourth n-channel transistor, wherein the drain of the fourth p-channel transistor is directly connected to the drain of the fourth n-channel transistor, wherein the gate of the fourth n-channel transistor receives the second latch second output, and wherein the source of the fourth n-channel transistor receives the first clock signal; and a fourth inverter directly connected to the drain of the fourth n-channel transistor, wherein the second quadrature signal is generated at an output of the fourth inverter.

* * * * *